(12) United States Patent
Teramoto et al.

(10) Patent No.: US 10,068,952 B2
(45) Date of Patent: Sep. 4, 2018

(54) DISPLAY DEVICE HAVING A RECESS PORTION IN AN INSULATING FILM AND A LIGHT EMITTING LAYER

(71) Applicant: JOLED Inc., Tokyo (JP)

(72) Inventors: Kazuma Teramoto, Tokyo (JP); Kenichi Nendai, Tokyo (JP); Jiro Yamada, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/416,376

(22) Filed: Jan. 26, 2017

(65) Prior Publication Data
US 2017/0213882 A1 Jul. 27, 2017

(30) Foreign Application Priority Data
Jan. 27, 2016 (JP) ................................ 2016-013513

(51) Int. Cl.
*H01L 29/08* (2006.01)
*H01L 51/40* (2006.01)
*H01L 27/32* (2006.01)

(52) U.S. Cl.
CPC ........ *H01L 27/3246* (2013.01); *H01L 27/326* (2013.01); *H01L 27/3211* (2013.01); *H01L 27/3276* (2013.01)

(58) Field of Classification Search
CPC ............. H01L 27/3246; H01L 27/3276; H01L 27/3211; H01L 27/326
See application file for complete search history.

(56) References Cited

U.S. PATENT DOCUMENTS

| 9,478,742 B2* | 10/2016 | Takagi | H01L 51/5218 |
| 2008/0143649 A1* | 6/2008 | Asaki | H01L 51/5203 345/76 |
| 2013/0001603 A1* | 1/2013 | Lim | H01L 51/5209 257/88 |
| 2013/0153876 A1* | 6/2013 | Minami | G09G 3/3233 257/40 |
| 2015/0001474 A1* | 1/2015 | Park | H01L 51/5271 257/40 |
| 2015/0060820 A1* | 3/2015 | Takagi | H01L 51/5218 257/40 |
| 2015/0206928 A1* | 7/2015 | Kimura | H01L 27/3246 257/88 |
| 2015/0380466 A1* | 12/2015 | Koo | H01L 27/3258 257/40 |

FOREIGN PATENT DOCUMENTS

| JP | 2005-340011 A | 12/2005 |
| JP | 2015-50011 A | 3/2015 |

* cited by examiner

*Primary Examiner* — Alonzo Chambliss
(74) *Attorney, Agent, or Firm* — Hauptman Ham, LLP

(57) ABSTRACT

According to one embodiment, a display device includes, a first insulating film including a recess portion having a first bottom surface and an inclined first side surface, a first electrode provided on the recess portion, a second insulating film provided on the first electrode, a light-emitting layer provided in the second insulating film and including a second bottom surface in contact with the first electrode and an inclined second side surface, and a second electrode provided on the light-emitting layer. The depth of the recess portion is greater than the thickness of the light-emitting layer, and the thickness of the second insulating film is greater than the depth of the recess portion.

20 Claims, 10 Drawing Sheets

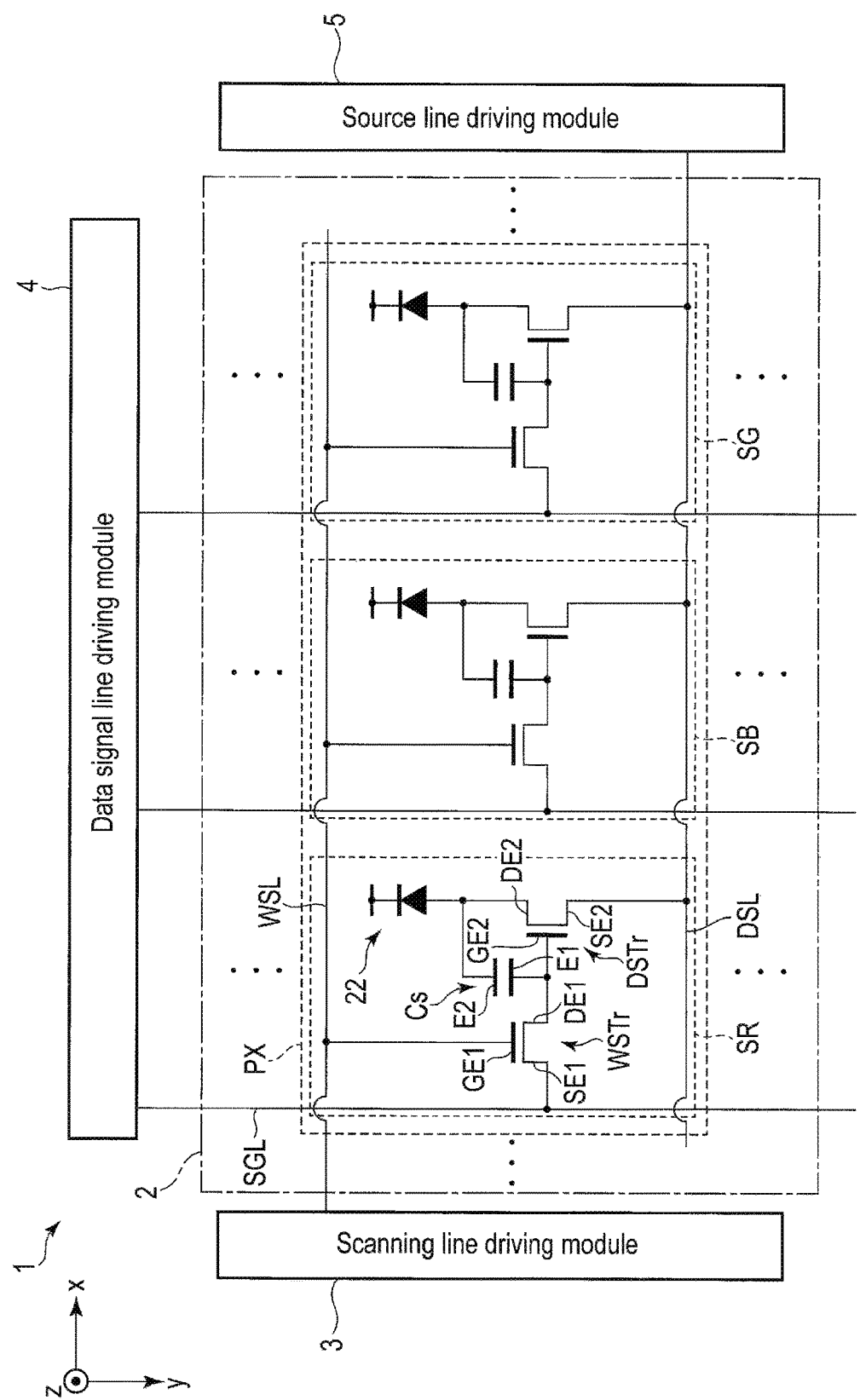
F I G. 1

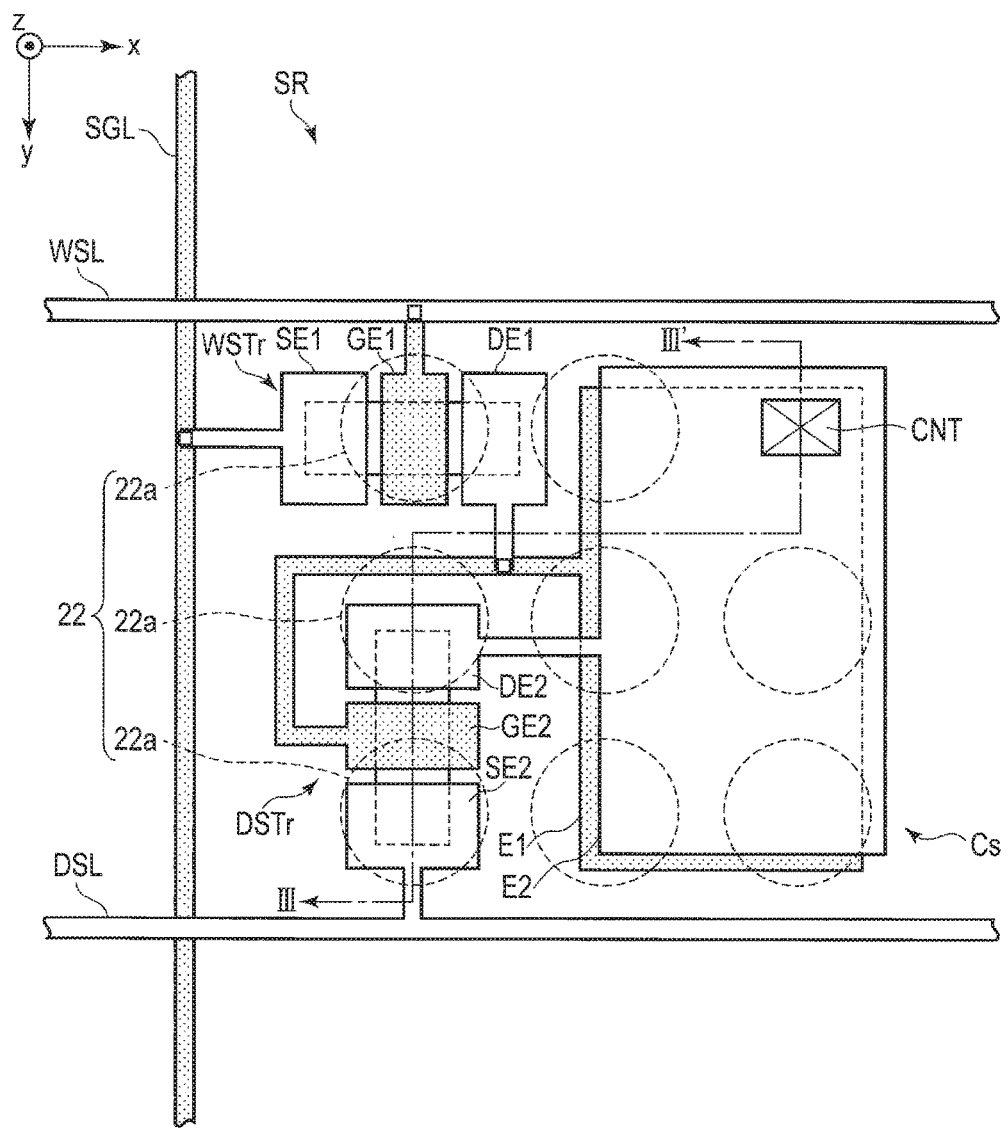
F I G. 2

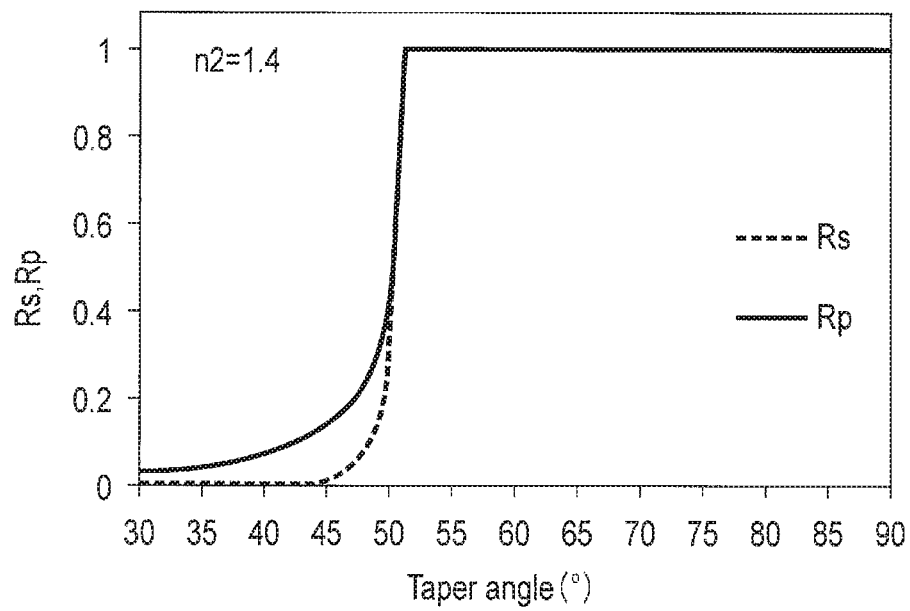
F I G. 7A
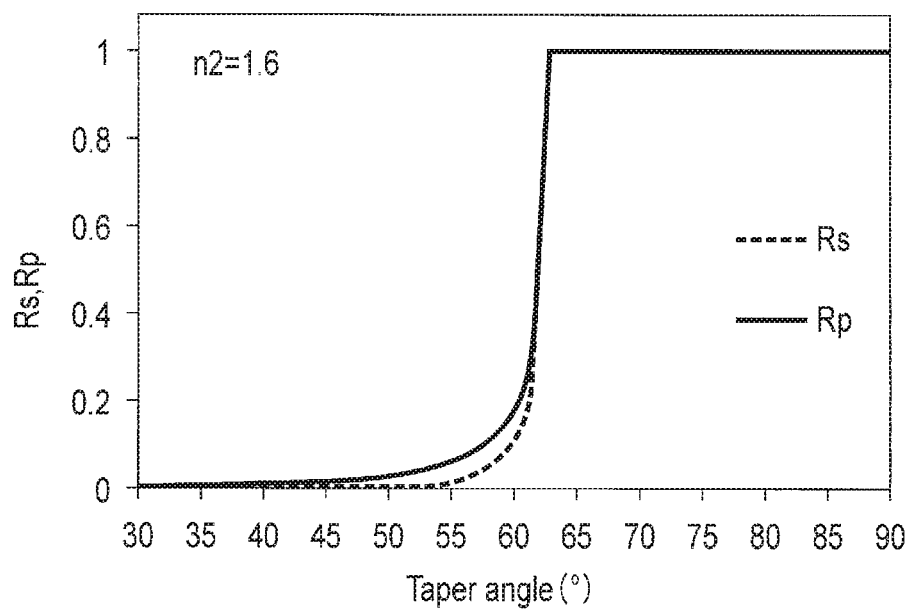
F I G. 7B

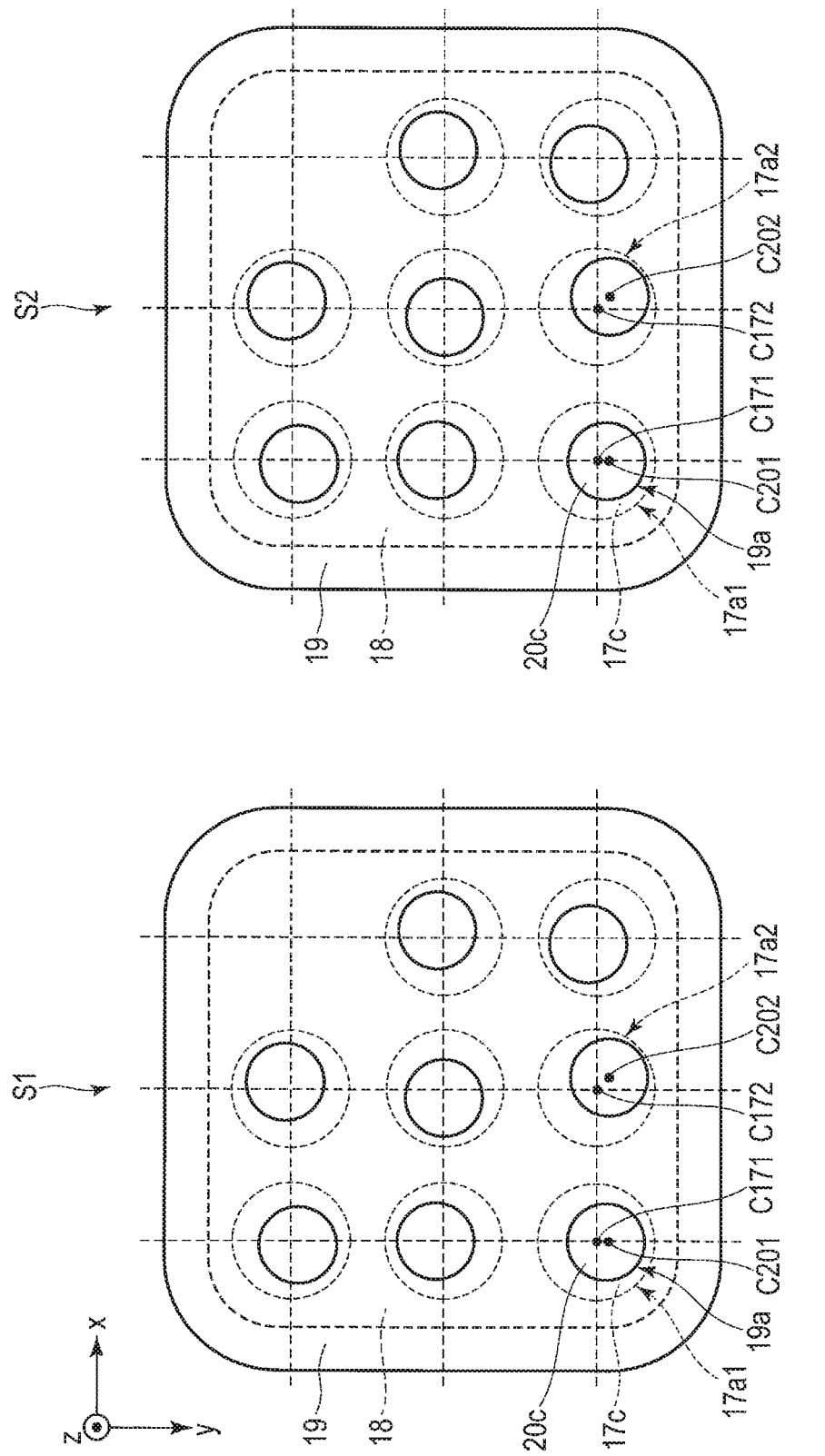
F I G. 9

DISPLAY DEVICE HAVING A RECESS PORTION IN AN INSULATING FILM AND A LIGHT EMITTING LAYER

CROSS-REFERENCE TO RELATED APPLICATIONS

This application is based upon and claims the benefit of priority from Japanese Patent Application No. 2016-013513, filed Jan. 27, 2016, the entire contents of which are incorporated herein by reference.

FIELD

Embodiments described herein relate generally to a display device comprising, for example, an organic electroluminescence (EL) element.

BACKGROUND

As a display of, for example, televisions, personal computers, smartphones, tablet computers, display devices comprising an organic EL element formed from organic material have been developed. The organic EL element emits light by applying voltage to the organic material disposed between an anode and a cathode. Light emitted from the organic material spreads in an isotropic fashion and is extracted from the device to the outside.

In the display device equipped with such an organic EL element, it is important to efficiently extract light emitted from the organic material to the outside of the device in order to suppress power consumption. Particularly, in mobile devices such as smartphones and tablet computers, it is necessary to control power consumption to retain the battery for a long time. Therefore, the improvement in the efficiency of light extraction is desired.

In recent years, for the improvement of the light extraction efficiency, an organic EL element comprising a reflection structure (reflector) has been developed, by which light emitted from an organic material is reflected by a metal electrode or an insulating film to be output to the outside of the device.

BRIEF DESCRIPTION OF THE DRAWINGS

FIG. 1 is a plan view showing an example of the circuit configuration of a display device according to the first embodiment.

FIG. 2 is a plan view showing a partial pattern of the circuit shown in FIG. 1.

FIG. 7A is a diagram showing the relationship between the taper angle of an insulating film and the optical reflectance in a z-axial direction in the case where the refractive index of the fourth insulating film is 1.4.

FIG. 7B is a diagram showing the relationship between the taper angle of an insulating film and the optical reflectance in a z-axial direction in the case where the refractive index of the fourth insulating film is 1.6.

FIG. 9 is a plan view showing a structure example of a first sub-pixel region and a second sub-pixel region according to the second embodiment.

DETAILED DESCRIPTION

Figure 3:
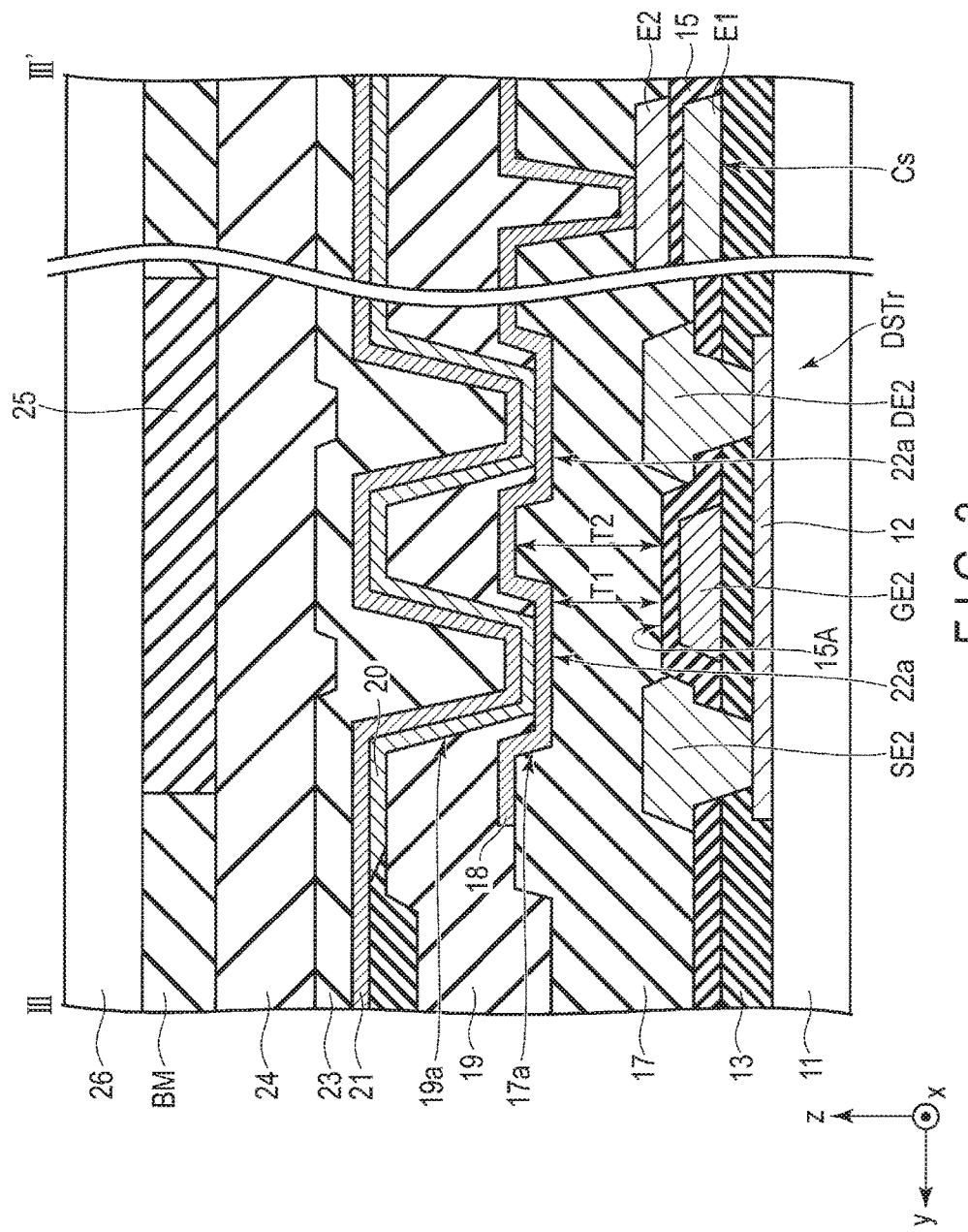
FIG. 3 is a cross section taken along the line III-III' in FIG. 2.

In general, according to one embodiment, there is provided a display device comprising: a substrate; a first insulating film provided on the substrate, including a first bottom surface and an inclined first side surface, and at least one recess portion having a first opening defined by the first side surface, an area of the first opening being greater than an area of the first bottom surface; a first electrode provided on the at least one recess portion therealong; a second insulating film provided on the first electrode; a light-emitting layer provided in the second insulating film and including a second bottom surface in contact with a part of the first electrode which corresponds to the first bottom surface, an inclined second side surface, and a second opening defined by the second side surface, an area of the second opening being greater than that of the second bottom surface; and a second electrode provided on the light-emitting layer, a depth of the at least one recess portion being greater than a thickness of the light-emitting layer, and a thickness of the second insulating film being greater than a depth of the at least one recess portion.

According to another embodiment, there is provided a display device including first and second sub-pixels, each of the first and second sub-pixels comprising: a substrate; a first insulating film provided on the substrate, including a first bottom surface and an inclined first side surface, and at least one recess portion having a first opening defined by the first side surface, an area of the first opening being greater than an area of the first bottom surface; a first electrode provided on the at least one recess portion therealong; a second insulating film provided on the first electrode; a light-emitting layer provided in the second insulating film and including a second bottom surface in contact with a part of the first electrode which corresponds to the first bottom surface, an inclined second side surface, and a second opening defined by the second side surface, an area of the second opening being greater than that of the second bottom surface; and a second electrode provided on the light-emitting layer, a depth of the at least one recess portion being greater than a thickness of the light-emitting layer, and a thickness of the second insulating film being greater than a depth of the at least one recess portion.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

FIG. 1 is a circuit diagram showing an example of the display device according to this embodiment. A display device 1 comprises a display module 2, a scanning line driving module 3, a data signal line driving module 4 and a power line driving module 5.

The display module 2 contains a plurality of pixels PXs arranged, for example, along row (x-axial) and column (y-axial) directions. FIG. 1 shows only one of the pixels PXs. The Pixel PX contains, for example, three sub-pixels SR, SB and SG. More specifically, the display module 2 comprises a plurality of scanning lines WSL extending along the row direction, a plurality of power lines DSL extending parallel to the scanning lines WSL and a plurality of data signal lines SGL extending along the column direction which intersects the scanning lines WSL. Ends of the scanning lines WSL are connected to the scanning line driving module 3, ends of the data signal lines SGL are connected to the data signal line driving module 4 and ends of the power lines DSL are connected to the power line driving module 5.

In the vicinity of each of the points of intersections between the scanning lines WSL and the data signal lines SGL, for example, a sub-pixel SR which emits light in red color, a sub-pixel SB which emits light in blue color and a sub-pixel SG which emits light in green color are disposed. The arrangement of the sub-pixels SR, SB and SG may be changed as needed. The pixel PX may comprise, for example, a white sub-pixel in addition to red, blue and green. Or the pixel PX may comprise one sub-pixel.

The structure of a sub-pixel will be described by taking an example of the sub-pixel SR. The other sub-pixels have a structure similar to that of the sub-pixel SR, and therefore only the sub-pixel SR will be discussed omitting the others.

The sub-pixel SR comprises a selection transistor WSTr, a drive transistor DSTr, a capacitor Cs and a light-emitting device 22. The light-emitting device 22 comprises an organic EL layer arranged between an anode and a cathode, which will be described later.

In the selection transistor WSTr, a gate electrode GE1 is connected to a respective scanning line WSL, a source electrode SE1, for example, is connected to a respective data signal line SGL, and a drain electrode DE1, for example, is connected to a first electrode E1 of the capacitor Cs and a gate electrode GE2 of the drive transistor DSTr. In the drive transistor DSTr, a drain electrode DE2, for example, is connected to a second electrode E2 of the capacitor Cs and the anode of the light-emitting device 22, whereas a source electrode SE2 thereof, for example, is connected to a respective power line DSL.

When a selection signal is supplied to the scanning line WSL, the selection transistor WSTr supplies a data signal supplied from a respective data signal line SGL in synchronous with the selection signal, to the gate electrode GE2 of the drive transistor DSTr. The capacitor Cs retains a gate potential of the drive transistor DSTr. The drive transistor DSTr supplies a drain current based on the gate potential to the light-emitting device 22. The light-emitting device 22 emits light at a brightness corresponding to the drain current.

FIG. 2 briefly shows an outline of the pattern of a sub-pixel region.

In FIG. 2, an anode electrode, a cathode electrode and an organic EL layer, which are not illustrated but constitute the light-emitting device 22, are formed above the selection transistor WSTr, drive transistor DSTr and capacitor Cs (surface side), as will be described later. The light-emitting device 22 comprises, for example, eight light-emitting modules 22a illustrated by dotted circles.

The data signal line SGL, the gate electrode GE1 of the selection transistor WSTr, the gate electrode GE2 of the drive transistor DSTr and the first electrode E1 of the capacitor Cs are formed from a first metal layer. The scanning line WSL, the power line DSL, the source electrode SE1 and drain electrode DE1 of the selection transistor WSTr, the source electrode SE2 and drain electrode DE2 of the drive transistor DSTr, and the second electrode E2 of the capacitor Cs are formed from a second metal layer.

The gate electrode GE1 of the selection transistor WSTr is connected to the scanning line WSL via a contact, the source electrode SE1 is connected to the data signal line SGL via a contact, and the drain electrode DE1 is connected to the gate electrode GE2 of the drive transistor DSTr and the first electrode E1 of the capacitor Cs via a contact. In the example illustrated, the gate electrode GE2 of the drive transistor DSTr and the first electrode E1 of the capacitor Cs are formed as one integral body, and the source electrode SE2 of the drive transistor DSTr and the power line DSL are formed as one integral body. The second electrode E2 of the capacitor Cs is connected to the anode electrode, which is not illustrated, via a contact CNT.

The multilayered structure of a sub-pixel region will be described with reference to FIG. 3.

FIG. 3 is a cross section showing an example of the sub-pixel region taken along the line III-III' shown in FIG. 2.

As shown in FIG. 3, the display device 1 according to this embodiment has the structure in which a wiring layer containing the drive transistor DSTr and the like, the light-emitting module 22a, a protective film 23, a sealing layer 24, a color filter 25 grade and the like are stacked in this order, from a first substrate 11 side to a second substrate 26 side, that is, z-axial direction. FIG. 3 shows a top-emission type structure in which the light emitted from the light-emitting module 22a is extracted from the second substrate 26 side (an upper section). Note that this embodiment is applicable also to a bottom-emission type display device.

The first substrate 11 is formed from, for example, an insulator material such as glass or plastic. On the first substrate 11, the drive transistor DSTr which drives the organic EL element (light-emitting device) 22 is formed. The drive transistor DSTr is, for example, a thin film transistor. FIG. 3 shows a top gate thin film transistor, but a bottom-gate thin film transistor comprising a gate electrode under a semiconductor layer may be formed.

The pattern of a semiconductor layer 12 which constitutes the drive transistor DSTr is formed on the first substrate 11. The semiconductor layer 12 is formed of, for example, a silicon-based material such as amorphous silicon or polycrystalline silicon, or an oxide semiconductor. On the semiconductor layer 12, the gate electrode GE2 is formed via a first insulating film 13. The gate electrode GE2 is covered by a second insulating film 15. The gate electrode GE2 is connected to the first electrode of the capacitor Cs and also to the drain electrode DE1 of the selection transistor WSTr via a contact hole, not shown, formed in a second insulating film 15.

On the second insulating film 15, the source electrode SE2 and the drain electrode DE2 are formed. The source electrode SE2 and the drain electrode DE2 are connected respectively to the source/drain regions of the semiconductor layer 12 via contact holes each made through the first insulating film 13 and the second insulating film 15. Further, the drain electrode DE2 is connected to the second electrode E2 of the capacitor Cs.

The capacitor Cs is formed on the first insulating film 13, and the first electrode E1 and the second electrode E2 oppose each other via the second insulating film 15. The first electrode E1 is located on the first insulating film 13, and is formed of the same material as that of the gate electrode GE2. The second electrode E2 is located on the second insulating film 15, and is formed of the same material as that of the drain electrode DE2.

On an entire surface of the second insulating film 15, a third insulating film (planerizing layer) 17 made of polyimide resin, for example, is formed so as to cover the source electrode SE2 and the drain electrode DE2. For the third insulating film 17, some other resin-based insulating material such as acrylic resin may be used. Alternatively, the third insulating film 17 may be formed from, for example, an inorganic insulating material such as silicon nitride (SiON) or silicon dioxide ($SiO_2$) by, for example, a chemical vapor deposition (CVD) method.

As shown in FIG. 3, a recess portion 17a which forms a reflector (reflection structure) to reflect light from the light-emitting module 22a is formed in the second substrate 26 side surface of the third insulating film 17 by, for example, a photolithography method. Therefore, the third insulating film 17 has a first film thickness T1 in a region where the recess portion 17a is formed, and a second film thickness T2 in a region where the recess portion 17a is not formed. The first film thickness T1 is less than the second film thickness T2. In the example illustrated, the first film thickness T1 and the second film thickness T2 are defined with reference to the upper surface 15A of the second insulating film 15 formed on the gate electrode GE2.

On the third insulating film 17 including the recess portion 17a described above, a first electrode (pixel electrode) 18 is formed as an anode electrode of the light-emitting module 22a. The first electrode 18 is connected with the drive transistor DSTr via the second electrode E2 of the capacitor Cs. The first electrode 18 is formed of, for example, an aluminum-neodymium (Al—Nd) alloy using a sputtering method and an etching method.

The first electrode 18 should desirably be formed of a material having high optical reflectance and high hole injection property. For this reason, the first electrode 18 may be of, for example, such a structure that a transparent electrode material having excellent hole injection property such as indium tin oxide (ITO) or indium zinc oxide (IZO) on a metallic film having high optical reflectance such as aluminum or an alloy containing aluminum.

On the third insulating film 17 on which the first electrode 18 is formed, a fourth insulating film 19 of, for example, polyimide resin is formed. The fourth insulating film 19 is formed from, for example, an acrylic resin, a fluoro-resin, a silicone resin, a fluorine-based polymer, or silicone-based polymer. The fourth insulating film 19 may be formed from, for example, an inorganic material such as silicon dioxide.

In a region of the fourth insulating film 19, which corresponds to the recess portion 17a of the third insulating film 17, that is, the region overlapping with the recess portion 17a, a hole 19a is formed to partially expose a bottom portion 18c of the first electrode 18. In the hole 19a and on the fourth insulating film 19, an organic EL layer 20 is formed using, for example, a printing method. On an entire area of the display module 2, which includes the top surface of the organic EL layer 20, a second electrode (common electrode) 21 is formed as a cathode electrode using, for example, the sputtering method. The second electrode 21 is formed from, for example, a semi-transmissive material such as a magnesium-silver (Mg—Ag) alloy.

On the second electrode 21, the protective film 23 of, for example, silicon nitride ($Si_{1-y}N_y$) is formed. The sealing layer 24 is formed on the protective film 23. With the sealing layer 24, the entering of, for example, oxygen, moisture, or the like into the light-emitting module 22a from the outside can be prevented.

On the sealing layer 24, the second substrate 26 comprising the color filter 25 and the light-shielding layer (black matrix) BM are stacked. The color filter 25 is formed in the regions corresponding to a plurality of light-emitting modules 22a so as to entirely cover these light-emitting modules 22a provided on the sub-pixel region. The color filter 25 transmits light of the same color as that emitted by a light-emitting module 22a, for example. When the light from the light-emitting module 22a is white, the color filter 25 of an arbitrary color may be provided. Note that the color filter 25 may be omitted.

The light-shielding layer BM is provided in a region where the color filter 25 is not formed. The light-shielding layer BM is formed from, for example, a black resin or a thin-film filter.

Figure 4:
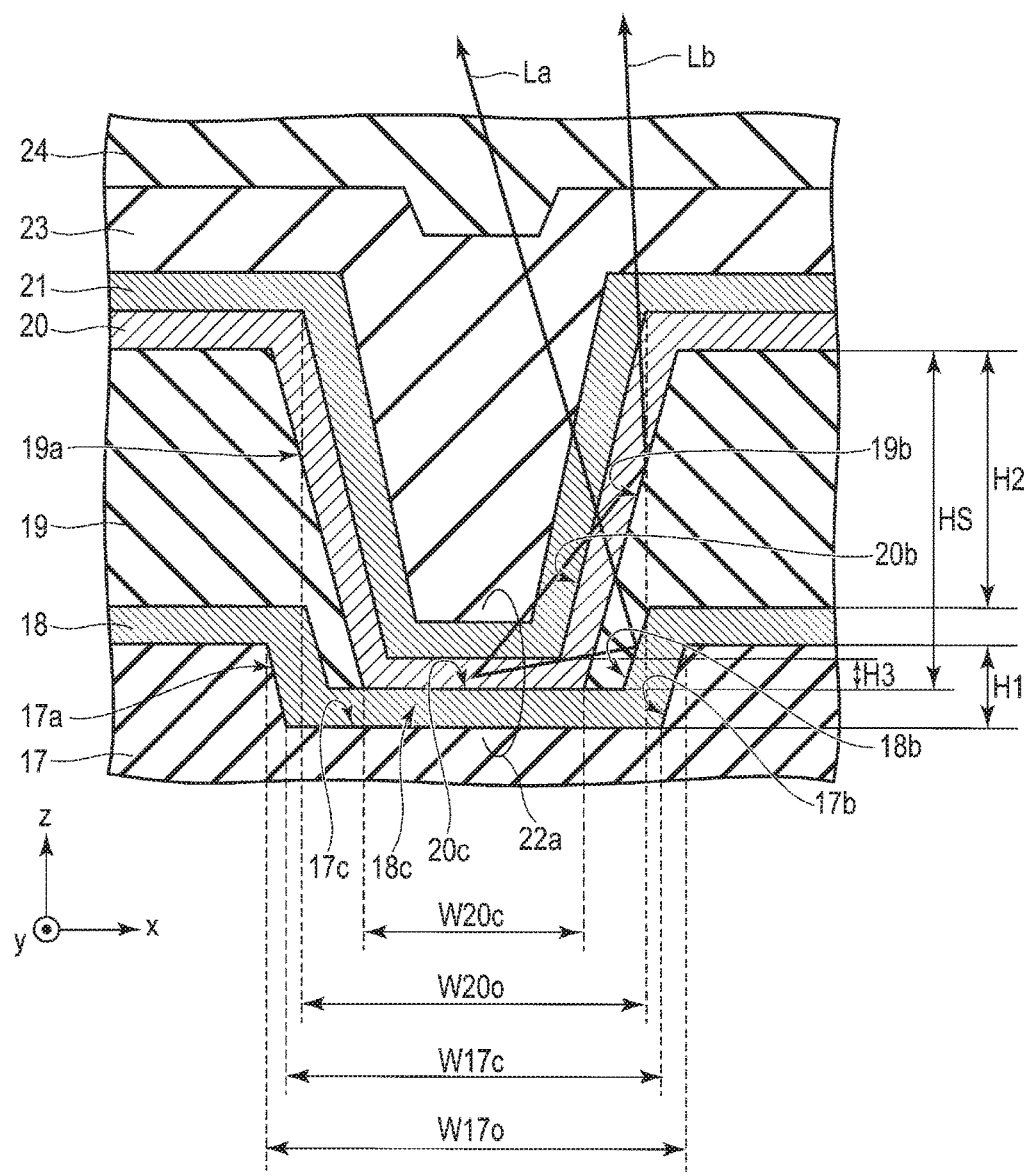
FIG. 4 is an enlarged view of a main portion of the cross section shown in FIG. 3.

FIG. 4 shows an expanded view of a light-emitting module 22a shown in FIG. 3. The recess portion 17a of the third insulating film 17 has, for example, a truncated cone shape and comprises a bottom surface (first bottom) 17c and an inclined side surface (first side) 17b. The side surface 17b of the recess portion 17a is opened from the bottom surface 17c upwards so that a diameter W17o of the opening (first opening) formed at the top of the side surface 17b is greater than a diameter W17c of the bottom surface 17c of the recess portion 17a. As an example, the diameter W17c of the bottom surface 17c of the recess portion 17a is 3 μm or more. Moreover, a depth H1 of the recess portion 17a formed in the third insulating film 17 is greater than a film thickness H3 of the organic EL layer 20.

With the second electrode 21 and the organic EL layer 20, the bottom portion 18c of the first electrode 18 constitutes the light-emitting module 22a. The first electrode 18 functions also as a reflective layer which reflects light from the light-emitting module 22a. That is, a side surface 18b of the first electrode 18 formed on the side surface 17b of the recess portion 17a of the third insulating film 17 reflects light La of that emitted from the light-emitting module 22a, which transmits through the fourth insulating film 19 and reaches the side surface 18b of the first electrode 18, in a direction towards the opening (upwards).

A film thickness H2 of the fourth insulating film 19 is defined by the distance from the edge face (upper surface) on the second substrate 26 side of the first electrode 18 to the edge face (upper surface) on the second substrate 26 side of the fourth insulating film 19. The fourth insulating film 19 has the film thickness H2 greater than the depth H1 of the recess portion 17a formed in the third insulating film 17. For example, H2 is greater than H1 and is 6 μm or less.

The fourth insulating film 19 divides adjacent sub-pixels from to each other as a pixel regulating layer, and also separates adjacent light-emitting modules 22a from each other in each sub-pixel region. That is, in the region where the fourth insulating film 19 is formed, the first electrode 18 and the organic EL layer 20 are separated and insulated from each other by the fourth insulating film 19.

The hole 19a formed in the fourth insulating film 19 has, for example, a truncated cone shape and a second substrate 26 side diameter of the hole 19a is greater than a first substrate 11 side diameter thereof. In other words, in the fourth insulating film 19, an inclined inner wall surface (side surface) 19b which defines the hole 19a is formed. The area of the light-emitting region defined by the opening on the first substrate 11 side of the hole 19a is less than that of the bottom portion 18c of the first electrode 18. Thus, the fourth insulating film 19 is formed between the bottom portion 18c and side surface 18b of the first electrode 18 and the organic EL layer 20. That is, the fourth insulating film 19 is in contact with the bottom portion 18c of the first electrode 18 in the region where the recess portion 17a is formed. The side surface 19b of the fourth insulating film 19 reflects light Lb of that emitted from the light-emitting module 22a, which is not reflected by the side surface 18b of the first electrode 18, in a direction towards the opening (upwards).

The organic EL layer 20 includes a bottom surface (second bottom) 20c in contact with the first electrode 18 exposed by the hole 19a formed in the fourth insulating film 19 and a side surface (second side) 20b formed on the inclined side surface 19b of the fourth insulating film 19. For this reason, a diameter W20o of the opening (second opening) formed by the inclined side surface 20b of the organic EL layer 20 is greater than a diameter W20c of the bottom surface 20c of the organic EL layer 20. Moreover, the diameter W20c of the bottom surface 20c of the organic EL layer 20 is less than the diameter W17c of the bottom surface 17c of the recess portion 17a.

The organic EL layer 20 may include a hole injection layer, a hole transportation layer, an electron transportation layer and an electron injection layer in addition to the light-emitting layer formed of an organic material. Moreover, the organic EL layer may be formed using, for example, a physical vapor deposition (PVD).

In connection with the above-described structure, the taper angle (tilt angle) of the side surface 19b of the fourth insulating film 19 will be described.

Figure 5:
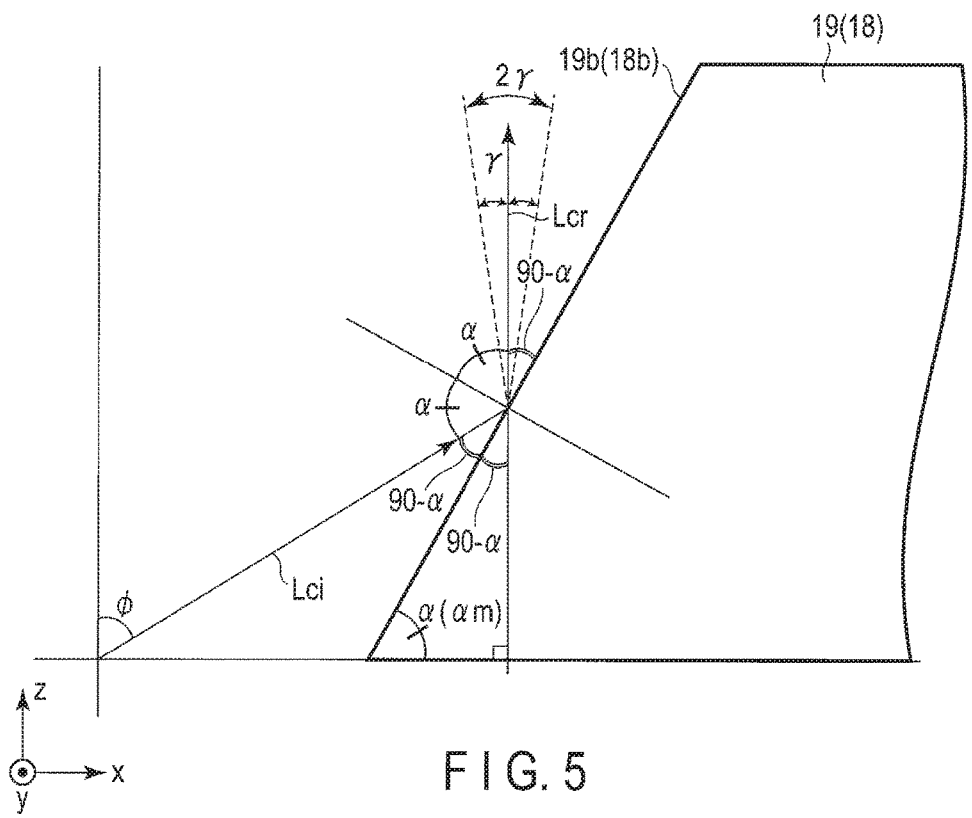
FIG. 5 is a diagram showing the relationship between the angle of light emitted from an organic EL layer and the taper angle of an insulating film shown in FIG. 4.

FIG. 5 is a diagram showing the relationship between the angle of light emitted from the organic EL layer 20 and the taper angle (tilt angle) of the side surface 19b of the fourth insulating film 19.

In FIG. 5, the x-y plane defined by the x-axis and the y-axis intersecting perpendicularly with the x-axis is defined as a plane parallel to the bottom surface 20c of the organic EL layer 20. Moreover, the z-axial direction is defined as the direction which intersects perpendicularly with the bottom surface 20c of the organic EL layer 20. The incident plane of light emitted from the bottom surface 20c of the organic EL layer 20 is the x-z plane.

The emission angle φ of the light emitted from the organic EL layer 20 is defined as an angle made by the emitted light and the z-axis. The taper angle α of the side surface 19b of the fourth insulating film 19 is defined as an angle less than 90 degrees (°) made by the x-y plane and the side surface 19b of the fourth insulating film 19. Here, the following relationship can be established between the emission angle φ of the light emitted from the organic EL layer 20 and the taper angle α of the side surface 19b of the fourth insulating film 19:

$$\varphi = 2(90-\alpha) = 180 - 2\alpha \tag{1}$$

$$\alpha = 90 - \varphi/2 \tag{2}$$

Moreover, of the light emitted from the organic EL layer 20, the light entering the side surface 19b of the fourth insulating film 19 is defined as incident light Lci and the light reflected by the side surface 19b of the fourth insulating film 19 is defined as reflected light Lcr.

When the incident light Lci is reflected in the z-axial direction, that is, when the angle made by the reflected light Lcr and the z-axis is 0°, the angle (reflection angle) made by the normal direction of the side surface 19b of the fourth insulating film 19 and the reflected light Lcr is equal to the taper angle α of the side surface 19b of the fourth insulating film 19. Moreover, the angle (incident angle) made by the normal direction of the side surface 19b of the fourth insulating film 19 and the incident light Lci is equal to the taper angle α of the side surface 19b of the fourth insulating film 19.

When light enters a medium having a refractive index of n2 from a medium having a refractive index of n1 which is larger than n2, the incident angle αt at which the light is totally reflected by the interface between the medium 1 and the medium 2 is defined as the critical angle αz, which is generally, represented by the following formula:

$$\alpha z(n1,n2) = \arcsin(n2/n1) \tag{3}$$

In this embodiment, for the total reflection of the incident light Lci in the z-axial direction, it is required that the taper angle α of the side surface 19b of the fourth insulating film 19 should be larger than the critical angle αz. When the refractive index of the organic EL layer 20 is n1 and the refractive index of and the fourth insulating film 19 is n2, the taper angle α of the side surface 19b of the fourth insulating film 19 should satisfy the following condition:

$$\alpha > \alpha z(n1,n2) = \arcsin(n2/n1) \tag{4}$$

Note that the second electrode 21 is as thin as about 10 nm and contributes little to the total reflection conditions set out above, it is neglected, but if the thickness is about 20 nm, it needs to be taken into consideration. In the following descriptions, it is assumed as an example that n1=1.8 and n2=1.5. In this case, the critical angle αz is about 56° (αz≈56°). Therefore, from the condition (4), the taper angle α of the side surface 19b of the fourth insulating film 19 for the total reflection of the incident light Lci in the z-axial direction should be:

$$\alpha > 56°$$

Note that as indicated by a dashed line shown FIG. 5, the incident light Lci may be totally reflected in a direction shifted by γ° from the z-axis. In this case, the taper angle α of the side surface 19b of the fourth insulating film 19 should satisfy the following conditions:

$$\alpha > \alpha z(n1,n2) + \gamma/2 = \arcsin(n2/n1) + \gamma/2 \tag{5}$$

Therefore, when, for example, γ=20°, the condition is: α>66°.

Next, a taper angle αm of the side surface 18b of the first electrode 18 shown in FIG. 4 will be described. The taper angle αm will be described in a similar manner to that of the taper angle α with reference to FIG. 5. That is, the taper angle αm of the side surface 18b of the first electrode 18 is defined as an angle smaller than 90° which is made between the x-y plane and the side surface 18b of the first electrode 18.

Of the incident light Lci which enters the side surface 19b of the fourth insulating film 19, the light transmitting the fourth insulating film 19 is reflected by the side surface 18b of the first electrode 18. In other words, the side surface 18b of the first electrode 18 reflects the light which is not totally reflected by the side surface 19b of the fourth insulating film 19. Therefore, the taper angle αm of the side surface 18b of the first electrode 18 is equal to or less than the critical angle αz.

On the other hand, as shown in FIG. 5, the emission angle φ of the light emitted from the organic EL layer 20 is 90° or less. Therefore, in order for the light entering the side surface 18b of the first electrode 18 shown in FIG. 4 to be reflected in the z-axial direction by the side surface 18b of the first electrode 18, the taper angle αm of the side surface 18b of the first electrode 18 is 45° or more from formula (1).

As described above, the taper angle αm of the side surface 18b of the first electrode 18 needs to satisfy the following conditions $$45° \leq \alpha m \leq \alpha z \qquad (6)$$

As described above, in the case where n1=1.8 and n2=1.5, αz is approximately 56° (αz≈56°). Therefore, the taper angle αm of the side surface 18b of the first electrode 18 should be:

$$45° \leq \alpha m \leq 56°$$

Note that the light entering the side surface 18b of the first electrode 18 may be totally reflected in a direction shifted by γ° from the z-axis. In this case, the taper angle αm of the side surface 18b of the first electrode 18 should satisfy the following conditions:

$$45°+\gamma/2 \leq \alpha m \leq \alpha z+\gamma/2 \qquad (7)$$

Therefore, for example, when γ=20°, the taper angle αm of the side surface 18b of the first electrode 18 should be $$55° \leq \alpha m \leq 66°$$

Note that in the above-provided descriptions, the side surface 19b of the fourth insulating film 19 and the side surface 18b of the first electrode 18 have linear shapes in the section of the truncated cone. But, the side surfaces may be curved upward, to have a convex surface. In that case, the taper angles of the side surface 19b and the side surface 18b each may be taken at a position half a height of each respective side surface, and an explanation similar to the case of the linear shape can be provided.

Figure 6:
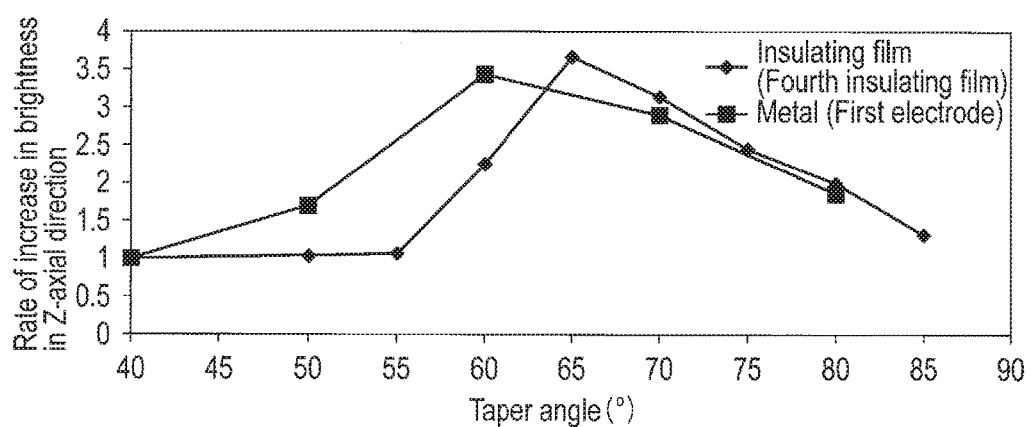
FIG. 6 is a diagram showing the relationship between the taper angle of an insulating film and the rate of increase in brightness by an insulating film, and the relationship between the taper angle of an electrode and the rate of increase in brightness by an electrode in a display device having a sectional shape similar to that shown in FIG. 4.

FIG. 6 is a graph in which plotted are the results of calculations of the rate in increase of the intensity of light (the increasing rate in brightness) reflected in the z-axial direction with respect to the taper angle in the material having a section of a truncated cone similar to that shown in FIG. 4. As to the material of the truncated cone, the cases where a material identical to that of the side surface 19b of the fourth insulating film 19 and also a metal identical to that of the side surface 18b of the first electrode 18 were both calculated.

The intensity of light reflected in the z-axial direction indicated by the vertical axis is normalized with respect to that obtained when the taper angle is 40°.

Note that in FIG. 6, the increasing rate in brightness was calculated on the condition that the ratio of the height of the cross section of the truncated cone (the height of the side surface) to the diameter of the bottom surface is 1.2. In an example case of the fourth insulating film 19, the "height of the surface side" is equivalent to the height HS shown in FIG. 4, and the "diameter of the bottom surface" is equivalent to the diameter W20c.

The increasing rate in brightness for the case of using the same material as the side surface 19b of the fourth insulating film 19 increased when the taper angle α exceeded 55°. This is because the taper angle α exceeded the critical angle αz, causing total reflection. The increasing rate in brightness in the z-axial direction by total reflection became maximum when the taper angle α was 65° and then decreased as the taper angle α exceeded 65°. This is because the taper angle α increases, the area of the portion of the organic EL layers 20, which can contribute to the increase in brightness in the z-axial direction decreases.

Therefore, from the graph, it is understood that when the taper angle α satisfies:

$$55° \leq \alpha \leq 80°$$

the optical reflectance is approximately 1, suggesting that the reflection of light by the same material as the side surface 19b of the fourth insulating film 19 contributes to the increase in brightness in the z-axial direction.

On the other hand, when the same metal as that of the side surface 18b of the first electrode 18 was employed, the increasing rate in brightness gradually increased as the taper angle αm increased in a range from 40° to 60°. This is because in the reflection by a metal surface there can be no conditions of angle imposed for total reflection. The increasing rate in brightness by the reflection on the metal surface became maximum at a taper angle αm of 60°, and decreased as the taper angle αm exceeded 60°. This is because the ratio of the light reflected in the direction shifted from the z-axial direction increases as the taper angle αm increases.

Therefore, from the graph, it is understood that when the taper angle αm satisfies:

$$50° \leq \alpha m \leq 80°$$

the reflection of light by the metal surface contributed to the increase in brightness in the z-axial direction.

As described above, by the contribution from both the reflection by the fourth insulating film 19 and the reflection of light transmitting the fourth insulating film 19 by the first electrode 18, the brightness in the z-axial direction can be enhanced.

Note that the above-described example has been described for the case where the refractive index n1 of the organic EL layer 20 is 1.8 and the refractive index n2 of the fourth insulating film is 1.5. But, the refractive indexes and the ratio therebetween (n2/n1) may be changed as appropriate.

FIG. 7 shows the relationship between the taper angle α of the side surface 19b of the fourth insulating film 19 and the reflectance that the incident light Lci is reflected in the z-axial direction, for a different refractive index n2 of the fourth insulating film 19. Note that in FIG. 7, the refractive index n1 of the organic EL layer 20 is 1.8.

As shown in FIG. 7A, in the case of, for example, n2=1.4, when the taper angle α of the side surface 19b of the fourth insulating film 19 is equal to or greater than αz(n2=1.4) (≈51°), the reflectance that the incident light Lci is reflected in the z-axial direction is 1. Therefore, the taper angle α of the side surface 19b of the fourth insulating film 19 should satisfy the following condition:

$$\alpha > 51°$$

Moreover, the condition which the taper angle $\alpha m$ of the side surface 18$b$ of the first electrode 18 should satisfy can be obtained from formula (6), which is:

$$45°≤\alpha m≤51°$$

On the other hand, as shown in FIG. 7B, in the case of, for example, n2=1.6, when the taper angle α of the side surface 19$b$ of the fourth insulating film 19 is equal to or greater than αz(n2=1.6) (≈63°), the reflectance that the incident light Lci is reflected in the z-axial direction is 1. Therefore, the taper angle α of the side surface 19$b$ of the fourth insulating film 19 should satisfy the following condition:

$$α>63°$$

Moreover, the condition which the taper angle $\alpha m$ of the side surface 18$b$ of the first electrode 18 should satisfy can be obtained from formula (6), which is:

$$45°≤\alpha m≤63°$$

Therefore, in order to achieve total reflection even if the refractive index n2 of the fourth insulating film 19 is greater than 1.5, the taper angle α of the side surface 19$b$ of the fourth insulating film 19 should more preferably satisfy the following condition:

$$70°≤α≤80°$$

Naturally, the taper angle $\alpha m$ of the side surface 18$b$ of the first electrode 18 should more preferably be:

$$55°≤\alpha m≤80°$$

As described above, according to this embodiment, of the light emitted from the light-emitting module 22$a$, the light La emitted at an angle nearly parallel to the bottom surface 20$c$ (x-y plane) of the organic EL layer 20 is reflected by the side surface 18$b$ of the first electrode 18 to be emitted in a direction substantially parallel to the z-axis perpendicular to the bottom surface 20$c$ of the organic EL layer 20. The light Lb, which is not reflected by the side surface 18$b$ of the first electrode 18, is reflected by the side surface 19$b$ of the fourth insulating film 19 to be emitted in a direction substantially parallel to the z-axis. Thus, with the two reflectors, the light extraction efficiency can be enhanced.

Further, according to this embodiment, the film thickness H2 of the fourth insulating film 19 provided on the first electrode 18 is set greater than the depth H1 of the recess portion 17$a$ made in the third insulating film 17 to form the side surface 18$b$ of the first electrode 18. Thus, the area of the side surface 19$b$ of the fourth insulating film 19, that is, the reflective surface, can be enlarged, making it possible to enhance the light extraction efficiency.

For example, in the case where metallic wiring lines of, for example, the selection transistor WSTr, the drive transistor DSTr and the capacitor Cs, are formed underneath the third insulating film 17, if the depth H1 of the recess portion 17$a$ formed in the third insulating film 17 is increased, for example, the electron ray, ultraviolet ray, etc. radiated during the lithography partially transmit the third insulating film 17 and are reflected by the metallic wiring lines. Consequently, in the region where metallic wiring lines are provided underneath, the amount of exposure of the third insulating film 17 is increased by the reflection of electron rays, ultraviolet rays, etc. For this reason, in some case, the amount of exposure varies between the region where the metallic wiring lines are provided underneath the third insulating film 17 and the region in which metallic wiring lines are not provided. As a result, the recess portion 17$a$ may not be formed in a uniform fashion, thereby making the brightness unstable. In order to suppress the adverse effect of the metallic wiring lines formed underneath the third insulating film 17, it is necessary to make the depth H1 of the recess portion 17$a$ of the third insulating film 17 less to such an extent that the adverse effect of the reflection by the metallic wiring lines can be suppressed. In this case, the area of the side surface 18$b$ of the first electrode 18 (the area of the reflective surface) formed on the side surface 17$b$ of the recess portion 17$a$ is decreased.

However, according to this embodiment, the inclined side surface 19$b$ is formed, above the first electrode 18, in the fourth insulating film 19, which has the film thickness H2 greater than the depth H1 of the recess portion 17$a$. With this structure, even if the rate of reflection by the first electrode 18 is reduced, the decrease in the light extraction efficiency can be suppressed by the side surface 19$b$ of the fourth insulating film 19.

Further, according to this embodiment, the organic EL layer 20 is formed in the hole 19$a$ of the fourth insulating film 19, and the fourth insulating film 19 is formed between the organic EL layer 20 and the side surface 18$b$ of the first electrode 18. In this manner, the effect which may be caused by displacement in patterning during the manufacturing process can be suppressed. For example, if the side surface 18$b$ of the first electrode 18 is not covered by the fourth insulating film 19, there may be an organic EL layer 20 formed, for example, on the side surface 18$b$ of the first electrode 18 if displacement in patterning occurs. In this case, the shape and area of each of the light-emitting surface and the reflective surface become uneven, thereby making it difficult to obtain stable brightness. However, according to this embodiment, even if the patterning slightly displaces, the contact between the side surface 18$b$ of the first electrode 18 and the organic EL layer 20 can be avoided and therefore the brightness can be stabilized.

Moreover, according to this embodiment, the organic EL layer 20 is formed so as to cover the bottom portion 18$c$ of the first electrode 18 exposed by the hole 19$a$ of the fourth insulating film 19, the side surface 19$b$ of the fourth insulating film 19 and the upper surface of the fourth insulating film 19. With this structure, the tolerance for displacement of the position where the organic EL layer 20 should be formed can be increased as compared to the case where the organic EL layer 20 is formed, for example, only in the hole 19$a$ of the fourth insulating film 19, thus facilitating the processing step of forming the organic EL layer 20. Therefore, the degradation in image quality, which may be caused by the displacement of the position in the formation of the organic EL layer 20 can be prevented.

Second Embodiment

When there is a periodic positional relationship between a light-emitting module 22$a$ of an organic EL layer 20 and a reflective surface which reflects light emitted from the light-emitting module 22$a$, the intensity of reflected light may be strengthened or weakened depending on its specific reflection angle, and thus moire (fringes) may occur.

According to the embodiment described above, the fourth insulating film 19 is formed between the side surface 18$b$ of the first electrode 18 and the organic EL layer 20, and therefore the center of the recess portion 17$a$ formed in the third insulating film 17 and the center of the hole 19$a$ (that is, the center of the light-emitting module 22$a$) formed in the fourth insulating film 19 can be intentionally shifted within a predetermined range.

The second embodiment utilizes the above-described feature to improve the light extraction efficiency, as well as to suppress the occurrence of moire in the sub-pixel regions and between sub-pixel regions.

Figure 8B:
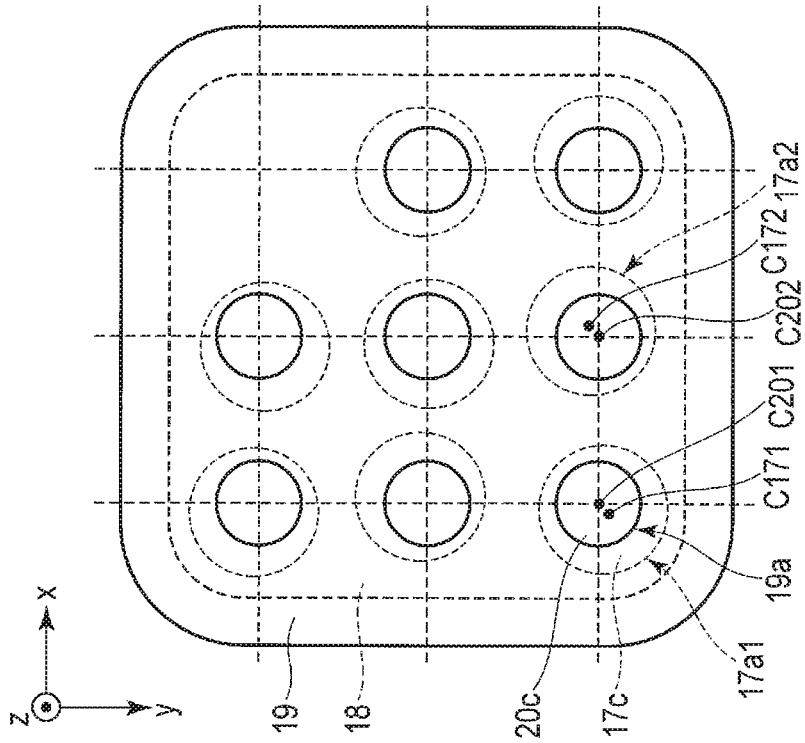
FIG. 8B is a plan view showing another example of the structure of a display device according to the second embodiment.
Figure 8A:
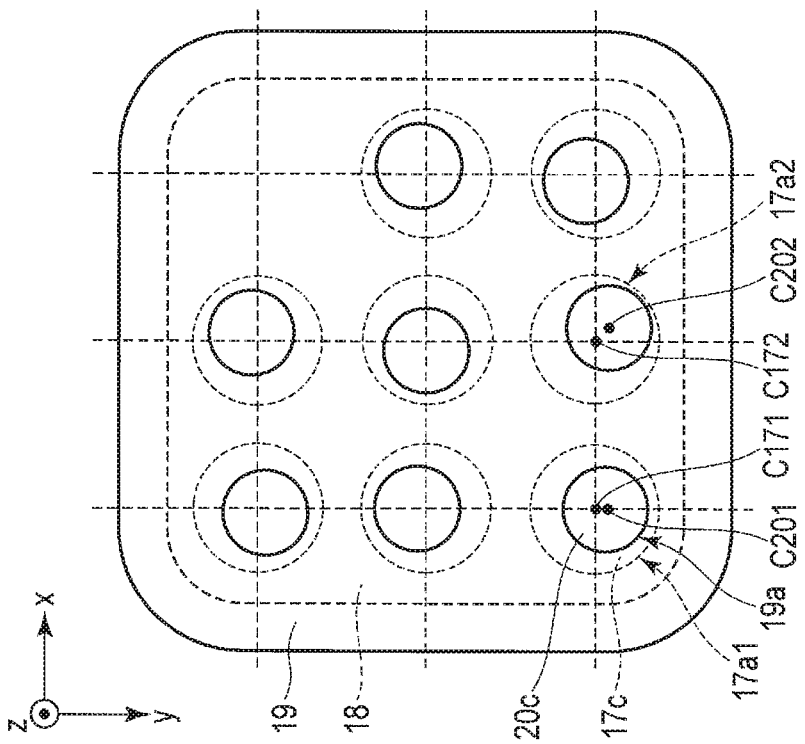
FIG. 8A is a plan view showing an example of the structure of a display device according to the second embodiment.

FIGS. 8A and 8B show examples of plane configuration of a display device according to the second embodiment. In FIGS. 8A and 8B, each dotted circle indicates a bottom surface 17c of a recess portion 17a formed in the third insulating film 17, and each solid circle illustrates a bottom surface 20c of the organic EL layer 20 (the light-emitting module 22a) defined by a hole 19a formed in the fourth insulating film 19.

FIGS. 8A and 8B each illustrate that eight recess portions 17a are formed in the third insulating film 17 in a sub-pixel region and eight light-emitting modules 22a are formed in the positions corresponding to the respective recess portions 17a.

As shown in FIGS. 8A and 8B, in the sub-pixel region, the positions of the bottom surfaces 17c of the recess portions 17a formed in the third insulating film 17 and those of the holes 19a formed in the fourth insulating film 19, i.e., the bottom surfaces 20c of the organic EL layer 20 are relatively displaced from each other, respectively.

For example, in the sub-pixel region, if a center C201 of a bottom surface 20c of the organic EL layer 20 is displaced towards the first direction, with relative to a center C171 of the respective recess portion 17a1 of those formed in the third insulating film 17, a center of at least one of the other bottom surfaces 20c of the organic EL layer 20, that is, in this case, a center C202, is displaced towards a direction different from the first direction with relative to a center C172 of the corresponding recess portion 17a2 of the third insulating film 17.

Alternatively, in the sub-pixel region, if the distance between a center C171 of one recess portion 17a1 of those formed in the third insulating film 17 and a center C201 of the bottom surface 20c of the organic EL layer 20 corresponding to the recess portion 17a1 is at a first distance, the distance between a center of at least one of the other recess portions 17a of the third insulating film 17, for example, a center C172 of the respective recess portion 17a2, and a center C202 of the bottom surface 20c of the organic EL layer 20 corresponding to the recess portion 17a2, may be different from the first distance.

In FIG. 8A, the recess portions 17a of the third insulating film 17 are arranged regularly (periodically), whereas the holes 19a formed in the fourth insulating film 19 are arranged irregularly.

In FIG. 8B, the holes 19a formed in the fourth insulating film 19 are arranged regularly, whereas the recess portions 17a formed in the third insulating film 17 are arranged irregularly.

When the display device according to this embodiment includes a plurality of sub-pixel regions, the pattern of arrangement of a plurality of recess portions 17a formed in the third insulating film 17 may be the same as or differing from that of a plurality of holes 19a formed in the fourth insulating film 19 between these sub-pixel regions.

For example, as shown in FIG. 9, in a first sub-pixel region S1 and a second sub-pixel region S2, if a center C201 of a bottom surface 20c of the organic EL layer 20 is displaced towards the first direction, with relative to a center C171 of the respective recess portion 17a1 of those formed in the third insulating film 17, a center of at least one of the other bottom surfaces 20c of the organic EL layer 20, that is, in this case, a center C202, may be displaced towards a direction different from the first direction with relative to a center C172 of the corresponding recess portion 17a2 of the third insulating film 17.

Figure 10:
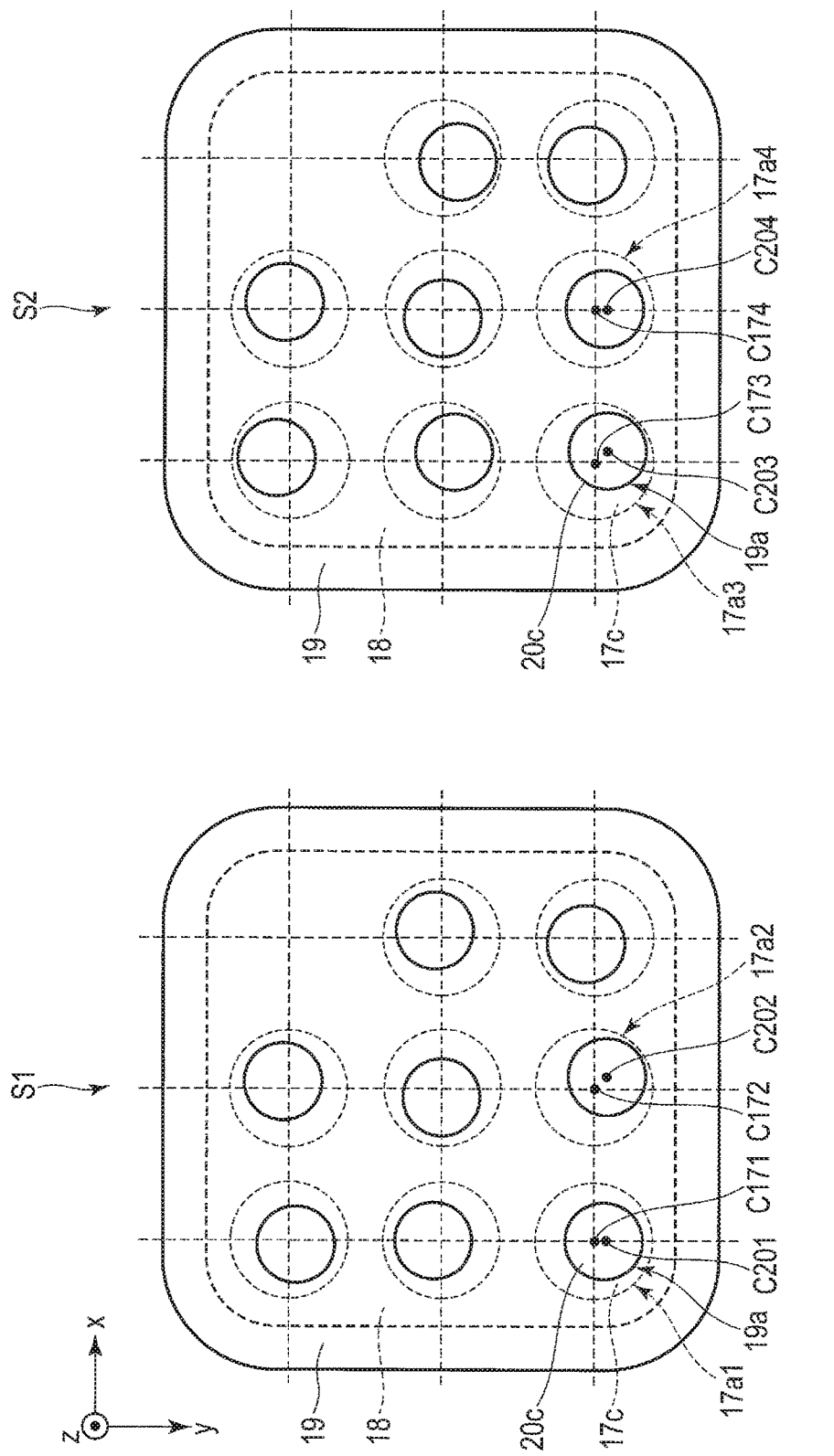
FIG. 10 is a plan view showing another structure example of the first sub-pixel region and the second sub-pixel region according to the second embodiment.

For example, as shown in FIG. 10, in the first sub-pixel region S1, if a center C201 of a bottom surface 20c of the organic EL layer 20 is displaced towards the first direction, with relative to a center C171 of the respective recess portion 17a1 of those formed in the third insulating film 17 and further a center of at least one of the other bottom surface 20c, that is, in this case, a center C202, is displaced towards the second direction different from the first direction, with relative to a center C172 of the respective recess portion 17a2 of those formed in the third insulating film 17, then, in the second sub-pixel region S2, a center C203 of a bottom surface 20c of the organic EL layer 20 may be displaced towards the second direction with relative to a center C173 of the corresponding recess portion 17a3 which corresponds to the recess portion 17a1 in the first sub-pixel region S1, and a center of at least one of the other bottom surfaces 20c, that is, in this case, a center C204, may be displaced towards, for example, the first direction with relative to the a center C174 of the respective recess portion 17a4 which corresponds to the recess portion 17a2 in the first sub-pixel region S1.

In the case where one light-emitting module 22a is formed in each sub-pixel region, the bottom surfaces 20c of the organic EL layer 20 are displaced in the first direction with relative to the corresponding recess portions 17a of the third insulating film 17 in the first sub-pixel region, whereas in the second sub-pixel region, the bottom surfaces 20c of the organic EL layer 20 are displaced in a direction different from the first direction with relative the corresponding recess portions 17a of the third insulating film 17.

Note that the shape of the recess portions 17a formed in the third insulating film 17 and that of the holes 19a formed in the fourth insulating film 19 may be changed as needed. More specifically, they may be arbitrary, for example, elliptical or rectangular.

According to this embodiment, there is no periodic positional relationship established between the light-emitting module 22a of the organic EL layer 20 and the reflective surface which reflects the emitted light, and therefore it is possible to prevent strengthening and weakening of the intensity of the reflected light at specific reflection angles. Therefore, the occurrence of the moire resulting from the reflection of external light can be reduced, thus improving the viewability.

Third Embodiment

Figure 11A:
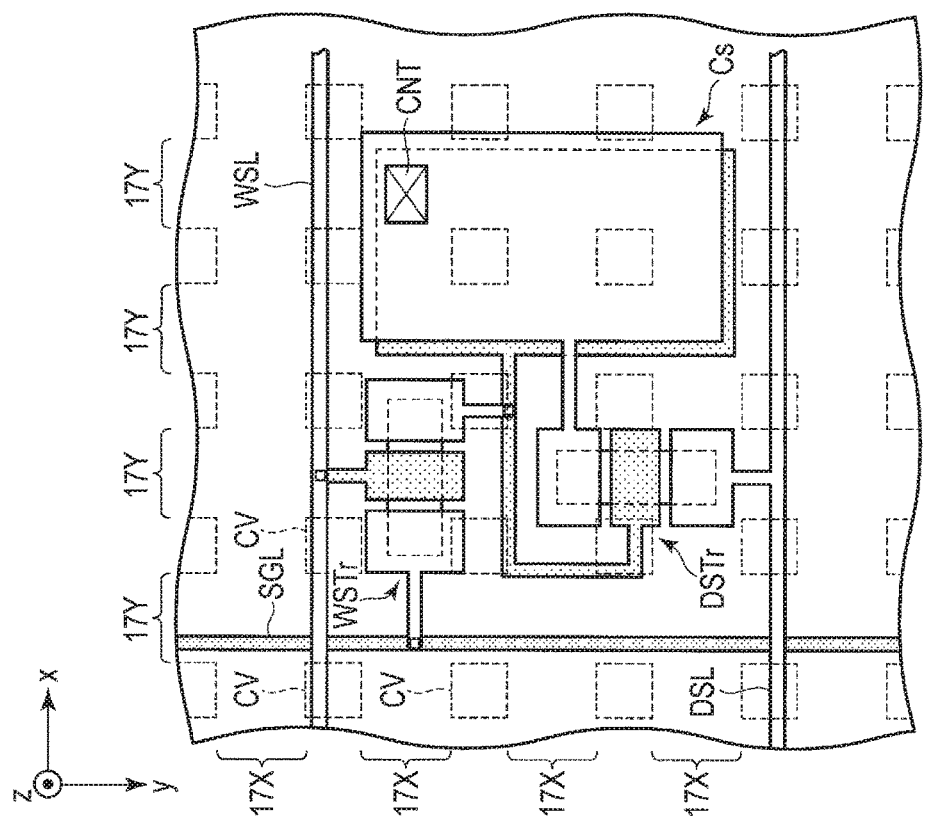
FIG. 11A is a plan view showing an example of the structure of a display device according to the third embodiment.
Figure 11B:
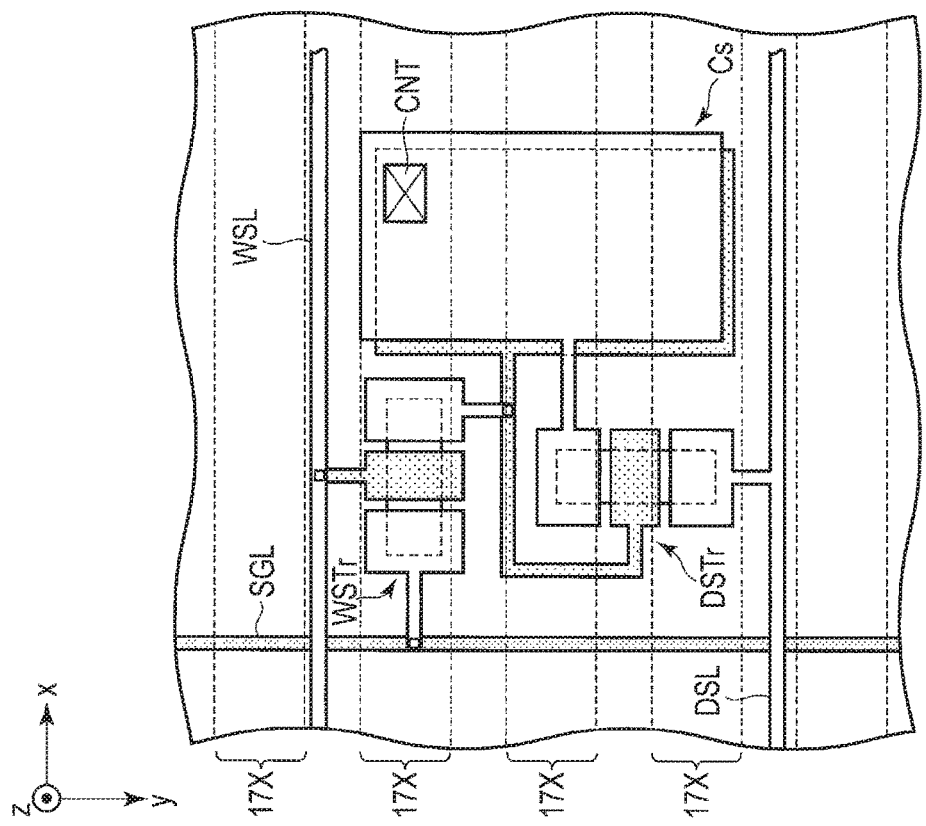
FIG. 11B is a plan view showing another example of the structure of a display device according to the third embodiment.

In first and second embodiments, the light-emitting module 22a has a circular plane shape. But, the planar shape of the light-emitting module 22a is not limited to circular. FIGS. 11A and 11B show the third embodiment.

FIG. 11A illustrates that a plurality of groove-like recess portions 17X are formed along the x-axial direction. FIG. 11B shows that recess portions are formed in a grid-like fashion. That is, a plurality of groove-like recess portions 17X are formed along the x-axial direction and a plurality of groove-like recess portions 17Y are formed along the y-axial direction. In FIG. 11B, the regions where the recess portions 17X and 17Y are not formed make island-like projections CV. The projections CV are arranged along the x-axial and y-axial directions in the shape of a matrix.

In this embodiment, the recess portions 17X and 17Y of a third insulating film 17 are continuously formed also in the non-light-emitting regions between adjacent sub-pixel regions (where the first electrode 18 is not formed). That is, the recess portions 17X and 17Y of the third insulating film 17 are formed continuously over a plurality of sub-pixel regions. The recess portions 17X intersect a data signal line SGL formed along the y-axial direction. The recess portions 17Y intersect a scanning line WSL and a power line DSL, which are arranged along the x-axial direction.

The shape of the section of the recess portions 17X taken along the y-axial direction and that of the recess portions 17Y taken along the x-axial direction are substantially similar to those of the first embodiment almost, and as shown in FIGS. 3 and 4, the light-emitting modules 22a are formed in the groove-like recess portions 17X and 17Y. The relationship between a depth H1 of the recess portions 17X and 17Y, a thickness H2 of the fourth insulating film 19 and a thickness H3 of the organic EL layer 20 is similar to that of the first embodiment. In FIG. 11A, the light-emitting modules are arranged into the shape of a stripe along the recess portions 17X. In FIG. 11B, the light-emitting modules are arranged along the recess portions 17X and 17Y into the shape of a grid.

According to this embodiment, the area of the light-emitting module in each sub-pixel region is greater as compared to the case where the planar shape of the light-emitting modules is circular; therefore it is possible to increase the contact area between the organic EL layer and the first electrode as the anode electrode. For this reason, the current density required to obtain the same quantity of light in the sub-pixel regions can be reduced, thereby making it possible to prolong the life of the light-emitting device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a substrate;
   a first insulating film provided on the substrate, including a first bottom surface and an inclined first side surface, and at least one recess portion having a first opening defined by the first side surface, an area of the first opening being greater than an area of the first bottom surface;
   a first electrode provided on the at least one recess portion therealong;
   a second insulating film provided on the first electrode;
   a light-emitting layer provided in the second insulating film and including a second bottom surface in contact with a part of the first electrode which corresponds to the first bottom surface, an inclined second side surface, and a second opening defined by the second side surface, an area of the second opening being greater than that of the second bottom surface; and
   a second electrode provided on the light-emitting layer,
   a depth of the at least one recess portion being greater than a thickness of the light-emitting layer, and a thickness of the second insulating film being greater than a depth of the at least one recess portion.

2. The display device of claim 1, wherein
   the at least one recess portion of the first insulating film is at least one groove.

3. The display device of claim 2, further comprising:
   a data signal line and a scanning line,
   wherein
   the at least one grooves intersects at least one of the data signal line and the scanning line.

4. The display device of claim 1, wherein
   the at least one recess portion of the first insulating film comprises at least two grooves, wherein a first groove of the at least two grooves intersects a second groove of the at least two grooves.

5. The display device of claim 1, wherein
   the second insulating film includes a third side surface inclined at an angle of $\alpha$, with respect to a surface parallel to the first bottom, and
   the angle $\alpha$ satisfies:

$$\alpha > \arcsin(n2/n1)$$

where n1 represents a refractive index of the light-emitting layer and n2 represents a refractive index of the second insulating film.

6. The display device of claim 5, wherein
   the first electrode includes a fourth side surface inclined at an angle of $\alpha m$, with respect to the surface parallel to the first bottom, and
   the angle $\alpha m$ satisfies:

$$45° \le \alpha m \le \arcsin(n2/n1).$$

7. The display device of claim 6, wherein
   the angle $\alpha m$ satisfies:

$$55° \le \alpha m \le 80°.$$

8. The display device of claim 5, wherein
   the angle $\alpha$ satisfies:

$$70° \le \alpha \le 80°.$$

9. The display device of claim 1, wherein
   a diameter of the second bottom surface is less than that of the first bottom surface.

10. The display device of claim 1, wherein
    the second insulating film is in contact with the first electrode in a region where the at least one recess portion is formed.

11. The display device of claim 1, wherein
    the first insulating film has a first thickness in a region where the first bottom surface is formed and a second thickness greater than the first thickness.

12. The display device of claim 1, wherein
    the at least one recess portion includes a first recess portion and a second recess portion, and
    a distance between a center of the third bottom surface of the light-emitting layer in the first recess portion and that of the fourth bottom surface of the first recess portion is a first distance, and a distance between a center of the fifth bottom surface of the light-emitting layer in the second recess portion and that of a sixth bottom of the second recess portion is differing from the first distance.

13. A display device including first and second sub-pixels, each of the first and second sub-pixels comprising:
    a substrate;
    a first insulating film provided on the substrate, including a first bottom surface and an inclined first side surface, and at least one recess portion having a first opening defined by the first side surface, an area of the first opening being greater than an area of the first bottom surface;
    a first electrode provided on the at least one recess portion therealong;
    a second insulating film provided on the first electrode;

a light-emitting layer provided in the second insulating film and including a second bottom surface in contact with a part of the first electrode which corresponds to the first bottom surface, an inclined second side surface, and a second opening defined by the second side surface, an area of the second opening being greater than that of the second bottom surface; and a second electrode provided on the light-emitting layer, a depth of the at least one recess portion being greater than a thickness of the light-emitting layer, and a thickness of the second insulating film being greater than a depth of the at least one recess portion.

14. The display device of claim 13, wherein the at least one recess portion of the first insulating film in each of the first and second sub-pixels includes a first recess portion and a second recess portion, a position of a third bottom surface of the light-emitting layer in the first recess portion is displaced in a first direction from a central portion of a fourth bottom surface of the first recess portion and a position of a fifth bottom surface of the light-emitting layer in the second recess portion is displaced in a second direction different from the first direction from a central portion of a sixth bottom surface of the second recess portion.

15. The display device of claim 13, wherein the at least one recess portion of the first insulating film in the first sub-pixel includes a first recess portion and a second recess portion, a position of a third bottom surface of the light-emitting layer in the first recess portion is displaced in a first direction from a central portion of a fourth bottom surface of the first recess portion and a position of a fifth bottom surface of the light-emitting layer in the second recess portion is displaced in a second direction different from the first direction from a central portion of a sixth bottom surface of the second recess portion, and the at least one recess portion of the first insulating film in the second sub-pixel includes a third recess portion corresponding to the first recess portion and a fourth recess portion corresponding to the second recess portion, a position of a seventh bottom surface of the light-emitting layer in the third recess portion is displaced in the second direction from a central portion of an eighth bottom surface of the third recess portion and a position of a ninth bottom surface of the light-emitting layer in the fourth recess portion is displaced in the first direction from a central portion of a tenth bottom surface of the fourth recess portion.

16. The display device of claim 13, wherein the at least one recess portion of the first insulating film in the first sub-pixel includes a first recess portion, a position of a third bottom surface of the light-emitting layer in the first recess portion is displaced in a first direction from a central portion of a fourth bottom surface of the first recess portion, and the at least one recess portion of the first insulating film in the second sub-pixel includes a second recess portion, a position of a fifth bottom surface of the light-emitting layer in the second recess portion is displaced in a second direction different from the first direction from a central portion of a sixth bottom surface of the second recess portion.

17. The display device of claim 13, wherein the second insulating film includes a third side surface inclined at an angle of $\alpha$, with respect to a surface parallel to the first bottom, and the angle $\alpha$ satisfies:

$\alpha > \arcsin(n2/n1)$ where n1 represents a refractive index of the light-emitting layer and n2 represents a refractive index of the second insulating film.

18. The display device of claim 17, wherein the first electrode includes a fourth side surface inclined at an angle of $\alpha m$, with respect to the surface parallel to the first bottom, and the angle $\alpha m$ satisfies:

$45° \leq \alpha m \leq \arcsin(n2/n1)$.

19. The display device of claim 18, wherein the angle $\alpha m$ satisfies:

$55° \leq \alpha m \leq 80°$.

20. The display device of claim 17, wherein the angle $\alpha$ satisfies:

$70° \leq \alpha \leq 80°$.

* * * * *